United States Patent [19]
Fritz et al.

[11] 4,149,026
[45] Apr. 10, 1979

[54] MULTI-PAIR CABLE HAVING LOW CROSSTALK

[75] Inventors: William B. Fritz; John R. Hopkins, both of Hershey, Pa.

[73] Assignee: AMP Incorporated, Harrisburg, Pa.

[21] Appl. No.: 685,828

[22] Filed: May 13, 1976

Related U.S. Application Data

[63] Continuation-in-part of Ser. No. 612,887, Sep. 12, 1975, abandoned.

[51] Int. Cl.² .............................................. H01B 7/08
[52] U.S. Cl. .................................. 174/32; 174/113 R; 174/117 F; 174/117 FF; 333/246
[58] Field of Search ................. 174/36, 117 R, 117 F, 174/117 FF, 113 R; 333/84 M

[56] References Cited

U.S. PATENT DOCUMENTS

| | | | |
|---|---|---|---|
| 3,173,991 | 3/1965 | Breakfield, Sr. | 174/117 FF |
| 3,179,904 | 4/1965 | Paulsen | 174/117 R X |
| 3,459,879 | 8/1969 | Gerpheide | 174/36 UX |
| 3,582,532 | 11/1969 | Plummer | 174/36 |
| 3,612,744 | 10/1971 | Thomas | 174/36 |
| 3,634,782 | 1/1972 | Marshall | 174/117 F X |
| 3,757,029 | 9/1973 | Marshall | 174/36 |
| 3,763,306 | 10/1973 | Marshall | 174/36 X |

*Primary Examiner*—Arthur T. Grimley
*Attorney, Agent, or Firm*—Russell J. Egan

[57] ABSTRACT

An improved cable having low crosstalk characteristics is comprised of a pair of multi-conductor cable members laminated together with the pairs of wires of and between the respective cable members being so spaced as to effectively form a balanced capacitivebridge configuration. The conductors of the cable members can be either round or flat in section and the cable members are preferably secured together across their entire width by means which allows the cables to be readily separated at the termination. This capability for separation of the cable members is also effective for inserting a tap means intermediate the ends of the cable.

22 Claims, 11 Drawing Figures

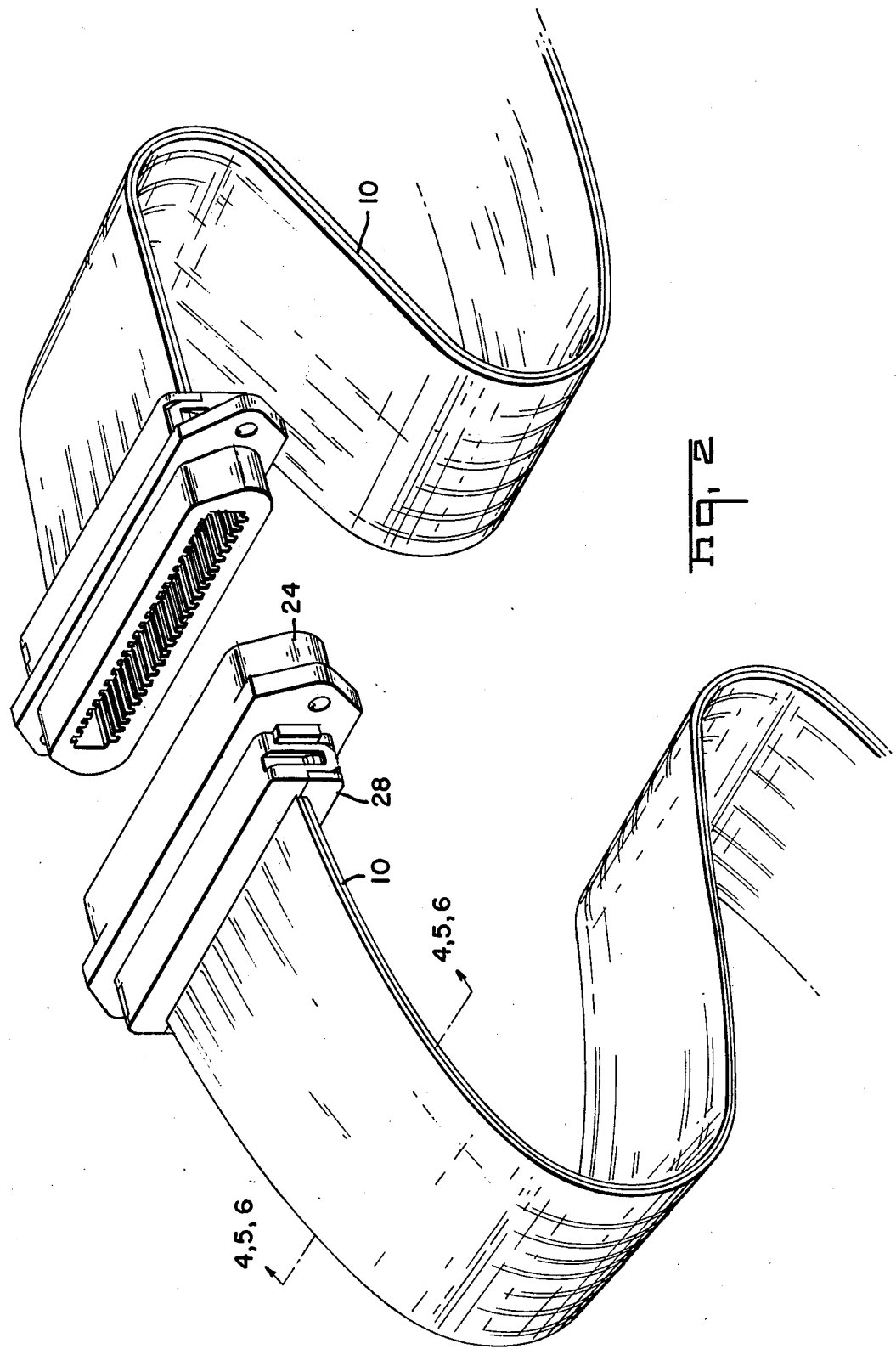

DRIVEN PAIR  QUIET PAIR

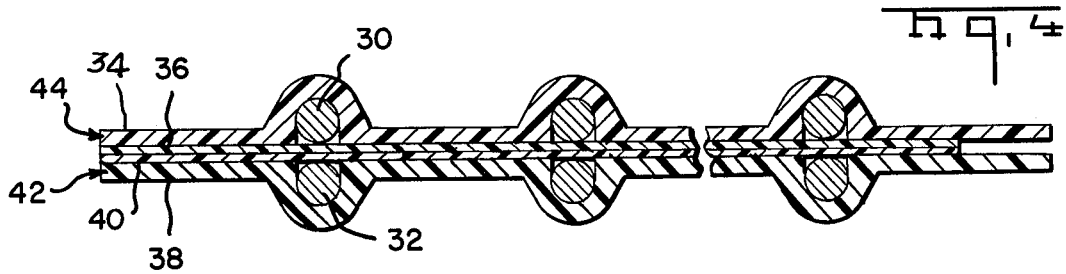
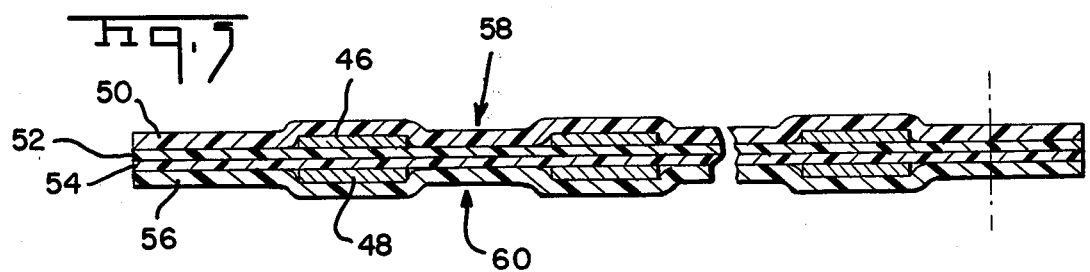
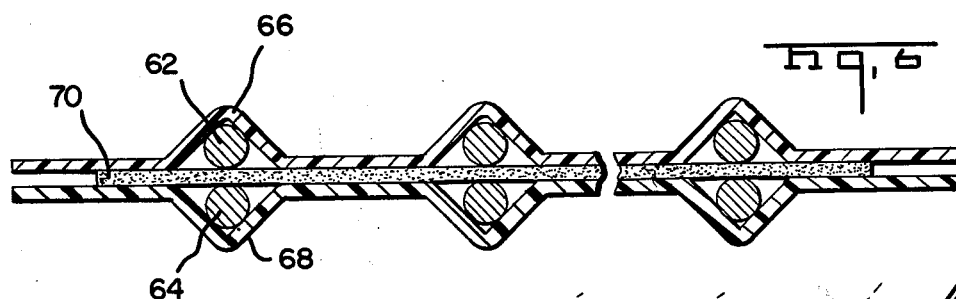
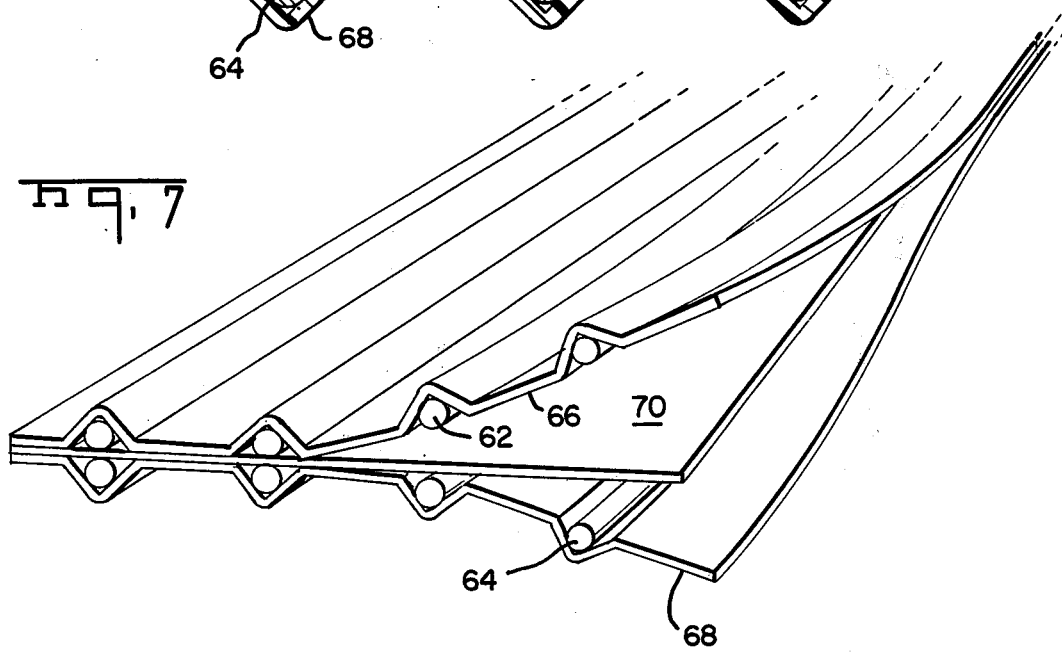

MULTI-PAIR CABLE HAVING LOW CROSSTALK

CROSS REFERENCE TO RELATED APPLICATION

The present application is a continuation-in-part of our application Ser. No. 612,887, filed Sept. 12, 1975 now abandoned.

BACKGROUND OF THE INVENTION

1. The Field Of The Invention

The present invention relates to cable having low crosstalk characteristics and in particular to multi-conductor cable, such as the twenty-five pair cable commonly used in balanced systems including telephone applications.

2. The Prior Art

A well known method to reduce crosstalk between pairs of conductors is to employ a twisted pair concept in which the individual pairs of conductors are loosely twisted about one another. This concept is carried over into multi-conductor cable such as the twenty-five pair cable used in telephone applications with the adjacent pairs in the cable having different twist lengths.

While this type of cable is effective in reducing the crosstalk in the cable it does have a number of significant disadvantages including the fact that it is generally difficult to make such a cable, since the manufacturing requires forming a number of pairs of twisted conductors and securing the pairs together by some means, such as a woven thread tying the pairs together as described in U.S. Pat. Nos. 1,941,121 and 3,627,903. More importantly it is quite difficult to terminate such a cable, even with sophisticated connectors such as those disclosed in U.S. Pat. Nos. 3,617,983; 3,760,335; 3,824,530; 3,808,582. The above-noted connectors are manufactured under the name Champ by AMP Incorporated of Harrisburg, Pennsylvania along with a line of tools for effecting the termination of multi-conductor cable with the connectors.

Even conventional multi-conductor cable, such as the standard twenty-five pair cable used by telephone systems and which does not have a twist built into the pairs of conductors, is often difficult to terminate. It takes even a skilled craftsman up to several minutes to make each termination, since the individual pairs of wires must be identified, separated, and inserted into the appropriate holding comb or contacts themselves. The obvious disadvantage to such a type of cable is the expensive labor involved in making the termination and the substantial impossibility of accomplishing such a termination by automated machinery.

A further disadvantage is that the currently used multi-conductor cable, of the type discussed above, is relatively bulky and must be run through partitions or through conduit. The bulk does not allow it to be installed in an inconspicuous manner in some desirable circumstances, such as being run under a carpet or along some other planar surface not provided with conduit. Such conditions can only be satisfied by the use of multi-conductor flat flexible cable.

One flat flexible cable which approaches the solution of the above problem is described in U.S. Pat. No. 3,764,727. The cable described therein is known as a pseudo-twisted pair cable with each of a pair of conductors being formed on opposite sides of a single substrate. Each of the pairs follows a prescribed meandering pattern so that effectively the pairs of conductors have a plurality of crossing points which, to a certain extent, simulates the capacitive effect obtained by a true twisted pair. While this cable is substantially less difficult to terminate than the previously described multi-conductor cables, it is still quite expensive to manufacture and the electrical characteristics of such a cable are not as good as had been expected. It should also be noted that this last named patent teaches that simply stacking cables will not effect a crosstalk decrease. Rather there must be an offset stacking of cables according to a prescribed formula in order to reduce crosstalk.

Another flat flexible cable which has been conceived includes separate layers of conductors held together by an outer jacket which extends across such layers to hold such layers together. One such construction is shown in U.S. Pat. No. 3,757,029. There is a problem with use of this kind of construction, however, in that cables having twenty-five or more conductors in each layer are sufficiently wide that outer jacket coverings cannot hold the conductors of the cable layers together toward the center of the cable. The layers tend to part and shift relative position as the cable is flexed in use. This precludes precision placement of conductors in use necessary to maintain the kind of crosstalk reduction achieved by controlled placement of conductor pairs called for in the present invention.

SUMMARY OF THE INVENTION

The present invention concerns an improved multi-conductor cable having a low crosstalk characteristic and the method of manufacturing the cable. The cable is formed by two separate members, each having a plurality of parallel spaced conductors secured to an insulation layer, with the members adhered together substantially across their width and positioned so that the conductors of each member have a fixed, parallel spaced relationship with a corresponding conductor of the other member. The spacing of the conductors is such that capacitance is substantially balanced therebetween thereby effecting a minimization of capacitive crosstalk between the conductors. The means adhering the cable members together is such that the spacing of the conductors between cables is maintained and yet the members can be readily separated for termination purposes.

It is therefore an object of the present invention to produce an improved multi-conductor cable having reduced crosstalk between pairs of conductors in the cable.

It is another object of the present invention to produce an improved multi-conductor cable of minimum profile, with reduced crosstalk characteristics, and which can be readily and rapidly terminated with known connector assemblies employing insulation piercing engagement of the conductors.

It is another object of the present invention to produce an improved multi-conductor cable having low crosstalk characteristics and which cable can be terminated and/or tapped at any point along the length thereof.

It is still another object of the present invention to produce an improved multi-conductor cable of low crosstalk characteristics and with such low profile that it can be run in an inconspicuous manner along planar surfaces and under planar objects without requiring recessed conduits while resisting damage from normal wear conditions.

It is further object of the present invention to produce an improved multi-conductor cable having a plurality of pairs of conductors in parallel fixed spaced relationship whereby the crosstalk between the conductors is minimized by capacitively balancing the cable.

It is yet another object of the present invention to produce an improved multi-conductor cable having low crosstalk by forming two cable members, each with a plurality of parallel evenly spaced conductors fixed thereto, and securing the members together in such fashion as to assure the fixed distance, aligned positioning of the conductors while allowing the cable members to be readily separated for termination.

It is a still further object of the present invention to produce an improved multi-conductor cable having low crosstalk characteristics by forming two cable members of insulating webs with a plurality of conductors adhered thereto in regular fixed spaced parallel relation and securing the cable members together with an adhesive member which allows the cable members to be readily separated for purposes of termination.

It is a still further object of the present invention to produce an improved multi-conductor cable having low crosstalk characteristics by forming two cable members of insulating webs with a plurality of conductors adhered thereto in regular fixed spaced parallel relation and laminating the cable members on opposite sides of a strip of high dielectric constant material whereby the diagonal capacitance is increased while the horizontal capacitance remains substantially unchanged.

It is yet another object of the present invention to produce an improved multi-conductor cable having low crosstalk characteristics and which cable can be readily and economically produced.

The means for accomplishing the foregoing objects and other advantages of the present invention will be apparent to those skilled in the art from the following detailed description taken with reference to the accompanying drawings.

BRIEF DESCRIPTION OF THE DRAWINGS

FIG. 2 is a perspective view of a cable formed according to the present invention and terminated by connectors of the type mentioned in reference to the prior art;

FIG. 3 is a perspective view, partially in section, showing an embodiment of the subject invention as it would be terminated by a known connector;

FIG. 4 is a transverse section through a first embodiment of a cable formed in accordance with the present invention;

FIG. 8 is a diagrammatic representation of the electrical characteristics of multi-conductor cable of known configuration;

FIG. 9 is a diagrammatic representation of the electrical characteristics of a cable according to the present invention;

DETAILED DESCRIPTION OF THE PREFERRED EMBODIMENT

The subject cable will be described with reference to a balanced electrical system, specifically a telephone system, installed in an area not having conduits but where it is desired to have inconspicuous wiring, for example, where it is desired to run cable through a carpeted area without leaving a tell-tale lump. It is also desired that the cable be so constructed as to not only be inconspicuous but to not be readily damaged by furniture and traffic while still providing good electrical characteristics. This is accomplished by the present invention in a manner not previously contemplated by the prior art discussed above.

Figure 1:
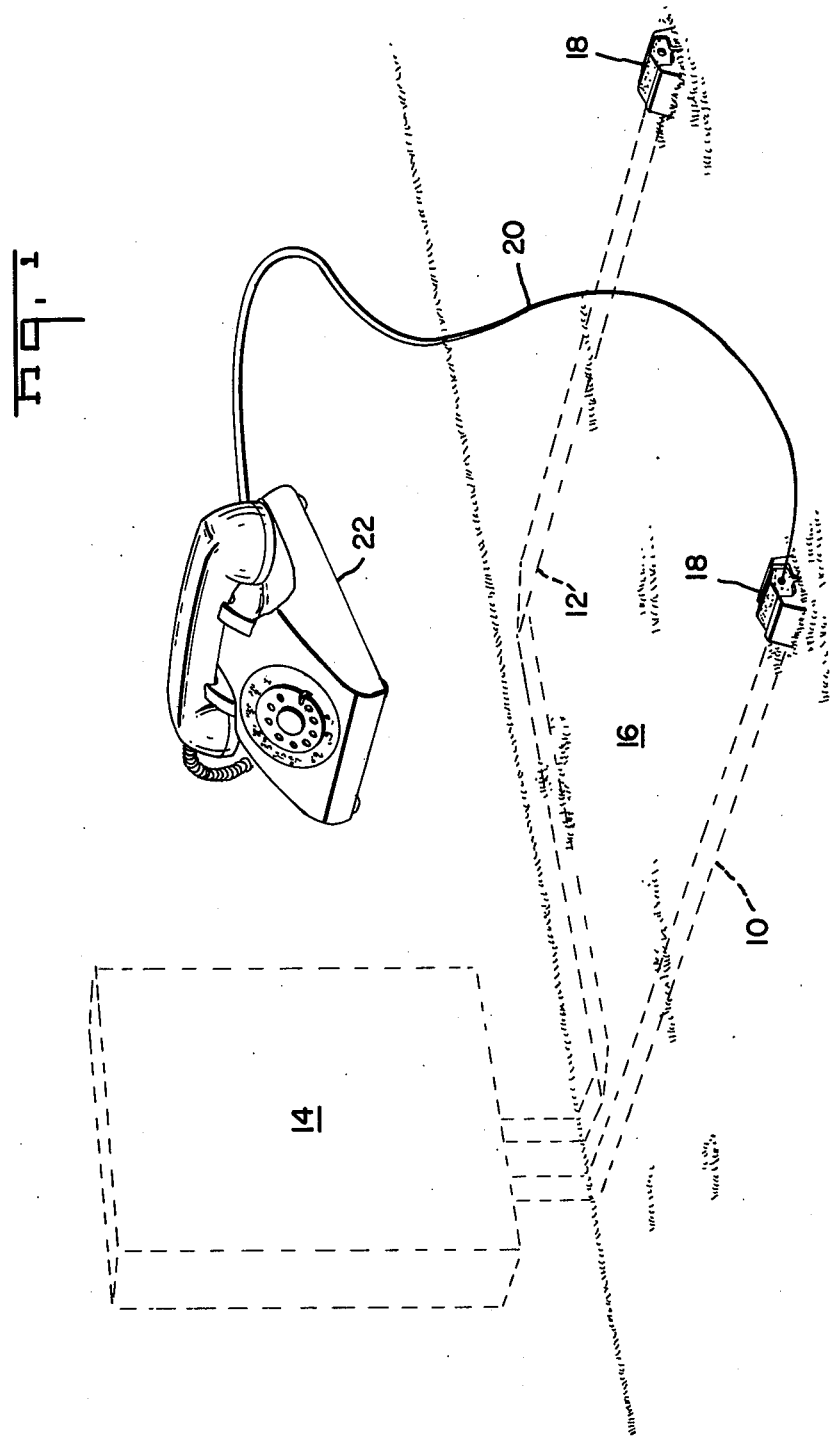
FIG. 1 is a diagrammatic representation of a use of the subject cable in an under carpet wiring configuration for a telephone system.

The subject cable is shown in an exemplary embodiment in FIG. 1 with cables 10, 12 running from a panel 14, under carpeting 16, to housings 18 where they are connected to the cable 20 of a conventional telephone desk set 22. The cables are terminated, see FIGS. 2 and 3, by known connectors, such as the AMP Champ connectors mentioned previously. Each connector 24 has a plurality of contacts 26 mounted therein. Each contact of the connector has a conductor engaging portion defining an insulation piercing slot. The cable is forced against the contacts which pierce the insulation and engage the conductors. The cable is then held in the connector by a strain relief member 28 which is clamped over the rear part of the connector housing and exerts a compressive force on the cable 10.

Figure 5:
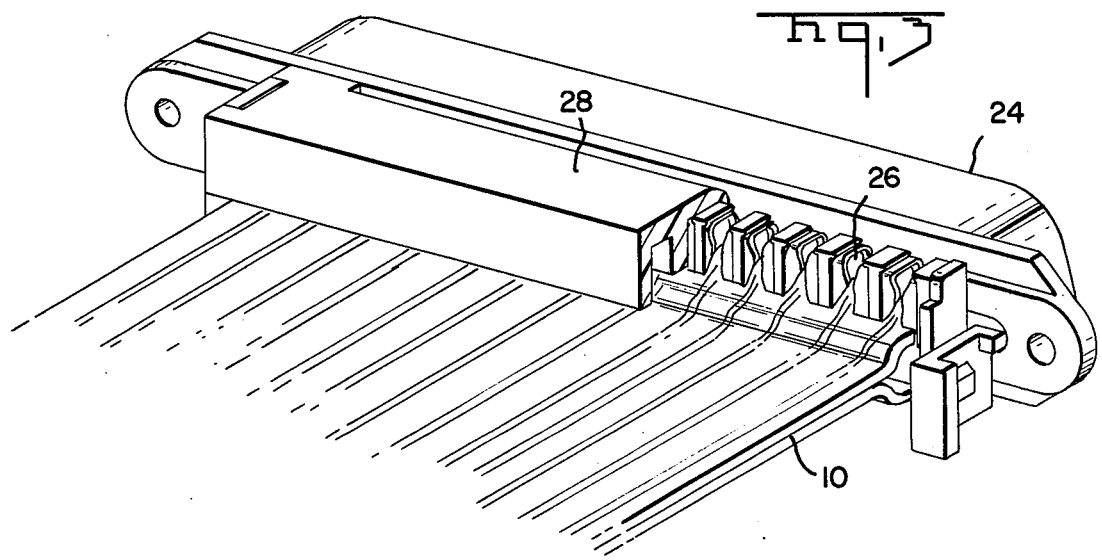
FIG. 5 is a transverse section through a second alternate embodiment of a cable formed in accordance with the present invention.
Figure 6:
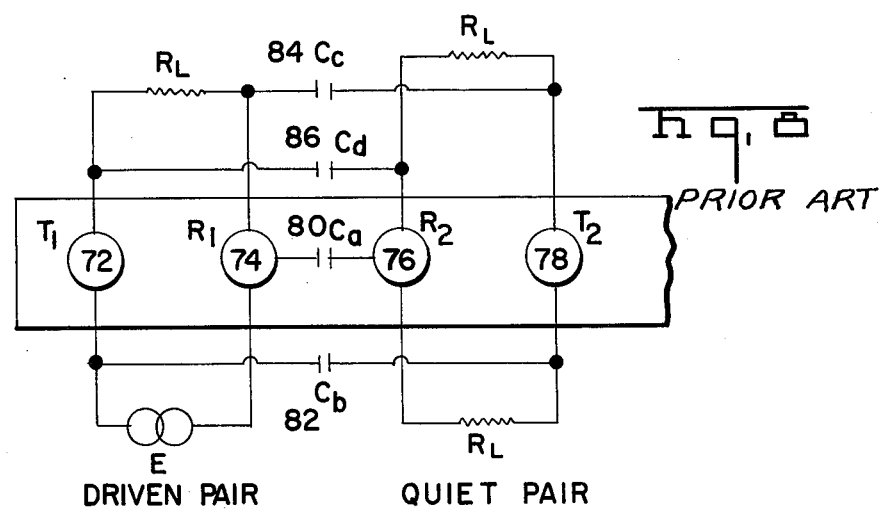
FIG. 6 is a transverse section through a third alternate embodiment of a cable formed according to the present invention.

Three embodiments of cable according to the present invention are shown in FIGS. 4 to 6. In each case the cable is an assembly of two identical cable members, each comprising a plurality of conductors bonded to an insulating carrier. The cable of FIG. 3 has a plurality of parallel, spaced round conductors 30, 32 embedded between two layers of flexible plastic insulation material 34, 36, 38, 40 to define two cable members 42, 44 which are secured together by an adhesive (not shown). The cable of FIG. 5 is similar to the cable of FIG. 4 except that flat conductors 46, 48 are embedded in layers 50, 52, 54, 56 of insulation material to form cable members 58, 60 which are secured together by an adhesive (not shown). The cable of FIG. 6 has a plurality of conductors 62, 64 bonded in respective profiled molded plastic backing members 66, 68 with the two cable members being secured together by a single adhesive layer 70 which also acts as an insulator between the individual conductors of each of the cable members.

Figure 7:
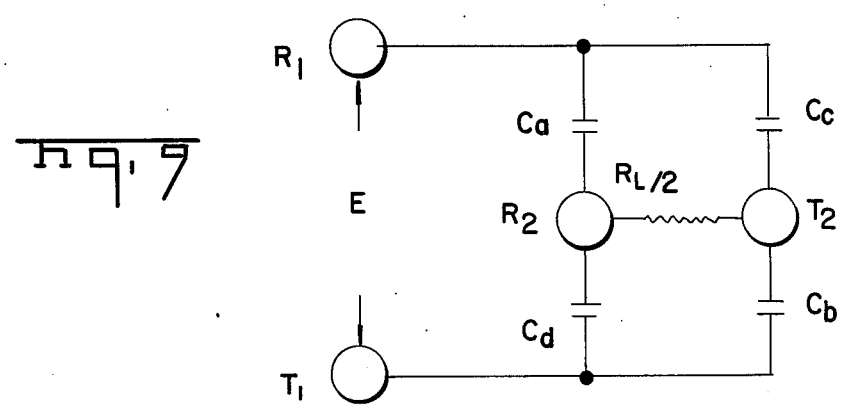
FIG. 7 is a diagrammatic representation showing an end of the cable formed in accordance with the second embodiment of FIG. 4 illustrating the way in which the cable would be opened to provide access to the conductors embedded therein.

FIG. 7 shows how the cable of FIG. 6 would be open to provide access to the conductors. The conductors are bonded to their respective insulating carrier members with an adhesive which has a greater affinity for the conductor than for the plastic or adhesive inner layer between the cable members. Thus the carrier members can be readily separated without displacing the conductors. It should also be noted that the adhesive inner layer 70 does not extend to both marginal edges of the members 66, 68 thus providing an easy way to separate the members.

In this regard the invention contemplates that the bond between insulating cover members may be continuous or periodic across or along the interior of facing surfaces of the members. This may be accomplished by lines or dots of adhesive on the interior surfaces of the members or on the interlayer. Alternatively, such bond may be accomplished with heat selectively applied to the cable. The important point is that the cable carrier members be held together in such fashion as to provide a substantially constant and uniform spacing between the conductors of the respective cable members which are designated as being a conductor pair.

It is contemplated that the separation of the cable members be accomplished by a peeling operation or a slitting operation. Either peeling or slitting could take place at the ends of the cable or intermediate the ends to effect a T top of the cable.

FIG. 8 shows a schematic of a flat cable formed in accordance with the prior art. Conductors 72, 74, respectively, are designated the tip and ring conductors of a driven pair and conductors 76, 78, respectively, comprise the tip and ring conductors of a quiet pair. It will be noted that a total of four capacitances 80, 82, 84, 86 will develop between the respective conductors of the pairs. Because of the unbalance of these capacitances, crosstalk will occur through capacitive coupling between the respective pairs.

The present invention is schematically shown in FIG. 9 wherein the capacitances have been shown rearranged in a balanced bridge arrangement. The conductors of the present cable are so spaced within each cable member and between two cable members such that the product $C_aC_b$ is substantially equal to the product $C_cC_d$. Thus as this equality is approached, the capacitive crosstalk will approach zero thereby effecting an overall improvement in the cable crosstalk characteristics, as the capacitive coupling in this type of cable is normally orders of magnitude higher than the inductive coupling.

As a specific example, a cable was constructed having a plurality of number 26 gauge AWG conductors with a center-to-center spacing of 0.085" within each cable member and a center-to-center spacing between conductors of the cable members of 0.025". The cable was 10 feet long and was inserted into a 600 ohm balanced to ground system. When a 1 KHz signal was applied to this cable, the crosstalk attenuation was measured at better than 100dB.

It should be noted that crosstalk in short run low frequency telephone circuits has been found to be principally due to capacitive coupling between the conductors forming the cables. Flat cable has capacity between the driven and quiet pairs as shown above and it is the object of the present invention to make these capacities substantially equal. It should further be noted that the present invention is suitable for use only in a balanced system such as found in telephone systems and would not usually or necessarily hold true for an unbalanced system such as used in the computer industry.

In general telephone usage, such as the above exemplary embodiment, the conductors are arranged in a plurality of pairs with the conductors of each pair termed ring and tip and these or other terms may be employed to identify selected conductors in the cable. In general the spacing between conductors of a given pair is dependent upon a choice of dielectric or geometry of insulating material with some spacing being held to practical limits of manufacture. This spacing can be on the order of between 0.001" to 0.010" with an improvement in crosstalk attenuation proportional to such spacing as limited by the capacitive loading of the pairs on the system.

Figure 10:
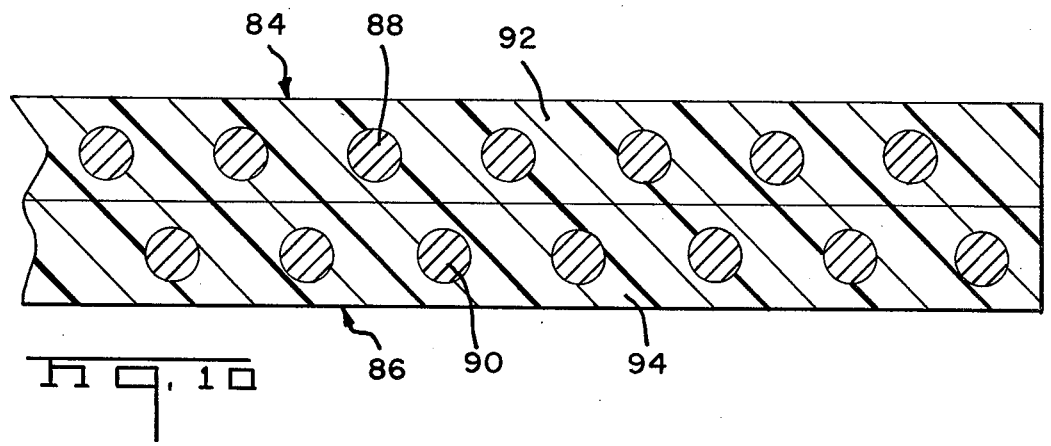
FIG. 10 is a transverse section through a fourth alternate embodiment of a cable formed according to the present invention.

As an alternative to the above-discussed embodiments, the conductors of one layer can be slightly offset with respect to the conduct in the adjacent layer. For example, as shown in FIG. 10, cable members 84, 86 have conductors 88, 90, respectively fixedly embedded in insulation 92, 94. The cable members are then permanently joined together with the conductors 88, 90 laterally offset a distance "d". It has been found that when cable members having 0.020 inch diameter solid wire on 0.085 inch horizontal and 0.030 inch vertical centers are assembled with a "d" of 20 to 35 mils, a further reduction in the capacitive crosstalk of up to 20 dB and a further reduction in the total crosstalk up to 13 dB can be realized.

Figure 11:
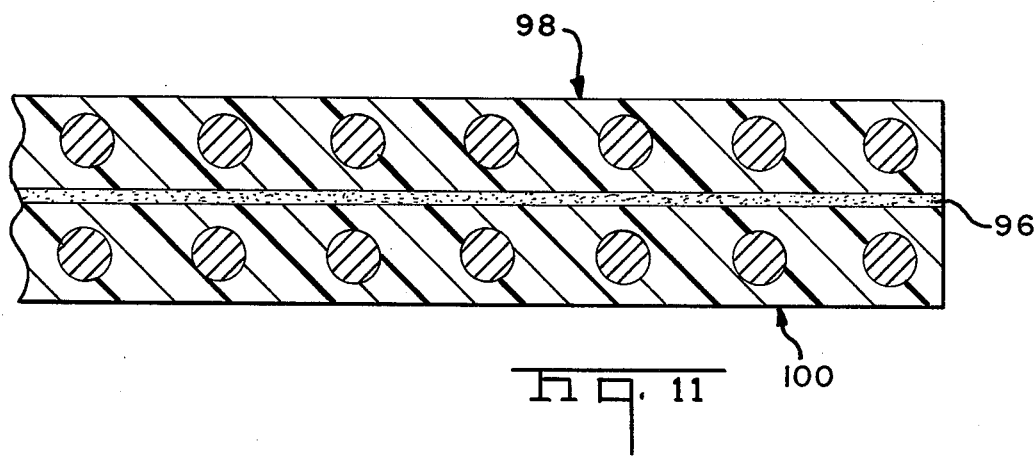
FIG. 11 is a transverse section through a fifth alternate embodiment of a cable formed according to the present invention.

A further alternative for reducing crosstalk in cables of the present type is to interleave a high dielectric constant material between the rows. This is shown in FIG. 11, wherein a layer 96 of dielectric material, such as barium titanate well mixed with poly vinyl chloride, is positioned between two cable members 98, 100. The effect of this additional layer is to increase the diagonal capacitance with a minimal effect on the horizontal capacitance. Thus, a closer capacitance balance can be realized. This embodiment is particularly useful when a minimum vertical spacing must be maintained. It also has the advantage of spreading the rows of conductors whereby termination of the cable will be facilitated, particularly with a slitting operation. For this reason it is also foreseen that the cable could be produced with pockets or pillows of high dielectric constant material therein at regular spaced intervals.

The present invention may be subjected to many changes and modifications without departing from the spirit or essential characteristics thereof. The present embodiments are therefore intended in all respect as being illustrative and not restrictive of the scope of the invention.

What is claimed is:

1. In a cable construction for a balanced electrical load including multiple pairs of conductors assigned ring and tip functions, a first array of ring conductors essentially equally spaced apart in essentially a plane, a second array of tip conductors essentially equally spaced apart in essentially a plane, means fixedly positioning the said ring and tip conductors forming a given ring and tip pair essentially parallel to each other and a distance apart from each other such that the product of the capacitances between adjacent ring and between adjacent tip conductors of adjacent pairs approaches the product of the capacitances between adjacent ring and tip conductors of adjacent pairs in order to provide an approximate balanced bridge condition to minimize crosstalk between pairs.

2. In a cable adapted to be terminated by a connector for use with telephone systems, a first array of ring conductors, a second array of tip conductors, insulating means holding said first array and said second array together with the said ring conductors and tip conductors parallel to each other to form ring and tip pairs spaced such that the product of the capacitances between adjacent ring conductors and adjacent tip conductors is substantially equal to the product of the capacitances between a given ring conductor of one pair and a given tip conductor of an adjacent pair an between the tip conductor of said one pair and the ring conductor of said adjacent pair, said insulating means being separable to provide an ordered array of ring conductors and an ordered array of tip conductors for termination, respectively, to a like array of ring terminals of a connector and a like array of tip terminals of said connector.

3. An improved electrical cable for balanced electrical load usage comprising:
first and second cable members each having at least one web of insulation material and a plurality of parallel, spaced conductors secured thereto in essentially a plane, and
means securing the cable members together transversely across the width thereof with respective conductors thereof in parallel alignment and forming a plurality of conductor pairs including one conductor form each cable member, the individual conductors of said pairs are positioned a distance apart such that the product of the capacitances between like conductors of adjacent pairs approaches the product of the capacitances between diagonally opposite conductors of adjacent pairs in order to provide an approximate balanced bridge condition to minimize crosstalk between said pairs of conductors.

4. An improved multi-conductor cable having low crosstalk characteristics and suitable for use in balanced electrical systems, such as telephone systems, said cable comprising:
first and second cable members each including a plurality of parallel, equally spaced conductors fixedly mounted to a web of insulation material, and
insulating means extending substantially across the transverse width of said cable and fixedly holding said cable members together with the conductors thereof in parallel alignment forming pairs of conductors between said members, said conductors of each pair being spaced apart a distance such that the product of the capacitance between like conductors of each pair is substantially equal to the product of the capacitances between diagonally opposite conductors of adjacent pairs of conductors, said insulating means being separable to provide an ordered array of first conductors and an ordered array of second conductors for termination to a like array of first and second terminals, respectively, of a connector.

5. A cable having low crosstalk characteristics and suitable for use with a balanced electrical load comprising:
a first plurality of first function conductors substantially equally spaced apart in a first parallel array fixed to a first web of insulating material;
a second like plurality of second function conductors substantially equally spaced apart in a second parallel array fixed to a second web of insulating material;
means securing said webs together across the width thereof with conductors of said first array overlying corresponding conductors of said second array forming a given pair of conductors which are substantially parallel to each other at a distance apart such that of the capacitances between first function conductors and second function conductors of adjacent pairs approaches the product of the capacitances between functionally diverse adjacent pairs in order to provide an approximate balanced bridge condition thereby minimizing crosstalk between pairs of conductors.

6. An improved multi-conductor cable for use in balanced electrical systems and having low crosstalk characteristics, comprising:
first and second cable members each including a web of insulation material and a plurality of conductors in the range of 22 to 28 gauge secured thereto in a regular parallel spaced array on approximately 0.085 inch centers, and
insulative adhesive means securing said cable members together with the conductors thereof aligned in a fixed spaced arrangement to form at least twenty-five pairs of conductors with the conductor of each pair spaced apart between 0.001 and 0.010 inches, whereby the capacitance relationship between pairs of conductors is effectively balanced to minimize capacitive crosstalk, with the product of the capacitances between adjacent conductors in said first cable and adjacent conductors in said second cable approaching the product of the capacitances between diagonally opposed conductors of adjacent pairs.

7. An improved multi-conductor cable according to claim 6 wherein the cable does not exceed thirty feet in length.

8. An improved multi-conductor cable according to claim 6 wherein each said cable member has twenty-five conductors to total twenty-five pairs of conductors.

9. An improved multi-conductor cable according to claim 6 wherein said conductors are 26 gauge wire.

10. An improved multi-conductor cable according to claim 6 wherein said conductors are solid round wire.

11. An improved multi-conductor cable according to claim 6 wherein said conductors are solid flat wire.

12. An improved multi-conductor cable according to claim 6 wherein said web of insulation material is a flexible plastic.

13. An improved multi-conductor cable according to claim 6 wherein said conductors are in an overlying arrangement.

14. An improved multi-conductor cable according to claim 6 wherein said conductors of said first and said second cable members are transversely offset with respect to each other.

15. An improved multi-conductor cable according to claim 6 further comprising a layer of high dielectric constant material interleaved between said first and said second cable members.

16. An improved multi-conductor cable according to claim 16 wherein said high dielectric constant material comprises barium titanate and poly vinyl chloride.

17. An improved multi-conductor cable according to claim 6 wherein said webs of insulation material each have a plurality of parallel spaced recesses equal in number to said conductors, and
said insulative adhesive means bonds said conductors in said recesses, said insulative adhesive means having a greater affinity for a metal to plastic bond than for a plastic to plastic bond whereby said cable members can be readily separated for termination.

18. An improved multi-conductor cable according to claim 6 wherein said webs of insulation material are of flexible plastic and encapsulate said conductors, and said insulative adhesive means is a web of flexible material coated on both sides with an adhesive and having a width slightly less than the width of said webs of insulation whereby said cable members can be readily separated for termination.

19. An improved multi-conductor cable according to claim 6 wherein said insulative adhesive means secures said cable members together across substantially their entire mating surfaces.

20. An improved multi-conductor cable according to claim 6 wherein said insulative adhesive means has a total width, relative to the width of said cable members, to assure fixation of the relative overlying positioning of said cable members.

21. A method of manufacturing improved multi-conductor cable having low crosstalk characteristics and suitable for use in balanced electrical systems, such as telephone systems said method comprising the steps of:
   forming first and second cable members each including a plurality of parallel, equally spaced conductors fixedly secured to like webs of flexible insulation material; and
   securing said cable members together across substantially their entire mating surfaces with an adhesive material so that the conductors thereof are held in fixed parallel alignment forming pairs of conductors between said members, said conductors of each pair being spaced apart a distance providing approximately constant and equal capacitance between conductors of a pair relative to the capacitance between diagonally opposite conductors of adjacent pairs of conductors, said adhesive material being separable to provide an ordered array of first conductors and an ordered array of second conductors for termination to a like array of first and second terminals, respectively, of a connector.

22. An improved multi-conductor cable according to claim 6 wherein conductors in said first cable comprise tip conductors and conductors in said second cable comprise ring conductors in a telephone system.

* * * * *

UNITED STATES PATENT OFFICE

CERTIFICATE OF CORRECTION

Patent No. 4,149,026          Dated April 10, 1979

Inventor(s) WILLIAM B. FRITZ ET AL

It is certified that error appears in the above-identified patent and that said Letters Patent are hereby corrected as shown below:

Column 7, line 3, after "adjacent pair" it should read - - - and - - - .

Column 7, line 21, "form" should read - - - from - - - .

Column 8, line 54, "claim 16" should read - - - claim 15 - - - .

Columns 9 and 10, cancel claim 21 lines 16 to 21 and 1 to 16 and substitute the following claim 21 therefore - - -

UNITED STATES PATENT OFFICE
CERTIFICATE OF CORRECTION

Patent No. 4,149,026     Dated   April 10, 1979

Inventor(s)  WILLIAM B. FRITZ ET AL

It is certified that error appears in the above-identified patent and that said Letters Patent are hereby corrected as shown below:

21. An improved multi-conductor cable according to claim 6 wherein said insulative adhesive means includes a patterned array of adhesive material extending substantially across the entire mating surfaces of said cable members. - - - .

Signed and Sealed this

Thirty-first Day of July 1979

[SEAL]

*Attest:*

*Attesting Officer*

LUTRELLE F. PARKER
*Acting Commissioner of Patents and Trademarks*